US 12,385,694 B2

(12) United States Patent
Wang et al.

(10) Patent No.: US 12,385,694 B2
(45) Date of Patent: *Aug. 12, 2025

(54) REFLOW FURNACE

(71) Applicant: ILLINOIS TOOL WORKS INC., Glenview, IL (US)

(72) Inventors: Yuwei Wang, Suzhou (CN); Yuexin Chen, Suzhou (CN)

(73) Assignee: Illinois Tool Works Inc., Glenview, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/740,985

(22) Filed: Jun. 12, 2024

(65) Prior Publication Data

US 2024/0344771 A1 Oct. 17, 2024

Related U.S. Application Data

(62) Division of application No. 17/115,435, filed on Dec. 8, 2020, now Pat. No. 12,013,185.

(30) Foreign Application Priority Data

Dec. 12, 2019 (CN) .......................... 201911274713.6

(51) Int. Cl.
*F27D 21/04* (2006.01)
*B23K 1/008* (2006.01)
(Continued)

(52) U.S. Cl.
CPC .............. *F27D 21/04* (2013.01); *B23K 1/008* (2013.01); *F27B 9/3005* (2013.01); *F27D 11/02* (2013.01);
(Continued)

(58) Field of Classification Search
CPC .. B23K 1/008; B23K 3/00; B23K 3/08; F27B 9/3005; F27B 2009/126; F27B 2009/3027;
(Continued)

(56) References Cited

U.S. PATENT DOCUMENTS 4,483,672 A * 11/1984 Wallace .................. F23N 5/105
431/58
4,569,658 A * 2/1986 Wiggins ................. A21B 1/245
99/473

(Continued)

FOREIGN PATENT DOCUMENTS

CN 201279647 7/2009
CN 108971683 12/2018
(Continued)

*Primary Examiner* — Steven B McAllister
*Assistant Examiner* — Benjamin W Johnson
(74) *Attorney, Agent, or Firm* — McAndrews, Held & Malloy, Ltd.

(57) ABSTRACT

The present disclosure discloses a reflow oven, comprising a heating zone, a cooling zone, a barrier and exhaust zone, a gas exhaust passage, a gas exhaust power device, and a detection device. The heating zone comprises a heating zone inlet and a heating zone outlet. The cooling zone comprises a cooling zone inlet and a cooling zone outlet. The barrier and exhaust zone is located between the heating zone outlet and the cooling zone inlet. An inlet of the gas exhaust passage is communicated with the barrier and exhaust zone. The gas exhaust power device is disposed on the gas exhaust passage. The detection device is disposed on the gas exhaust passage and used for detecting parameters of gas in the gas exhaust passage, wherein the parameters of the gas reflect a blockage condition of the gas exhaust power device.

9 Claims, 6 Drawing Sheets

(51) Int. Cl.
  *F27B 9/30*  (2006.01)
  *F27D 11/02*  (2006.01)
  *B23K 3/00*  (2006.01)
  *B23K 3/08*  (2006.01)
  *F27B 9/12*  (2006.01)
  *F27D 21/00*  (2006.01)
  *H05K 3/30*  (2006.01)
  *H05K 3/34*  (2006.01)

(52) U.S. Cl.
  CPC .......... *B23K 3/00* (2013.01); *B23K 3/08* (2013.01); *F27B 2009/126* (2013.01); *F27B 2009/3027* (2013.01); *F27D 2021/0007* (2013.01); *F27D 2021/0057* (2013.01); *H05K 3/303* (2013.01); *H05K 3/34* (2013.01); *H05K 3/3494* (2013.01); *H05K 2203/043* (2013.01)

(58) Field of Classification Search
  CPC .. F27D 11/02; F27D 21/04; F27D 2021/0007; F27D 2021/0057; H05K 3/303; H05K 3/34; H05K 3/3494; H05K 2203/043

USPC .......................................................... 432/32
  See application file for complete search history.

(56) References Cited

U.S. PATENT DOCUMENTS

| | | | | |
|---|---|---|---|---|
| 5,641,341 | A | * | 6/1997 | Heller .................... B23K 1/203 165/95 |
| 7,914,595 | B2 | | 3/2011 | Nakamura |
| 9,234,700 | B1 | * | 1/2016 | Gaur ........................ F26B 21/12 |
| 12,013,185 | B2 | | 6/2024 | Wang |
| 2009/0282973 | A1 | | 11/2009 | Nakamura |
| 2013/0309958 | A1 | * | 11/2013 | Bach .................... G05D 7/0682 454/256 |
| 2019/0195219 | A1 | * | 6/2019 | Okuno .................... F04B 37/14 |

FOREIGN PATENT DOCUMENTS

| | | |
|---|---|---|
| CN | 109420814 | 3/2019 |
| CN | 109950176 | 6/2019 |
| CN | 110385497 | 10/2019 |

* cited by examiner

-Prior Art-

-Prior Art-

REFLOW FURNACE

RELATED APPLICATIONS

The present application is a divisional of and claims priority to U.S. patent application Ser. No. 17/115,435, filed on Dec. 8, 2020, now U.S. Pat. No. 12,013,185, issued on Jun. 18, 2024, which claims the benefit of Chinese Patent Application No. 201911274713.6, filed Dec. 12, 2019, entitled "REFLOW FURNACE." The entirety of U.S. Pat. No. 12,013,185 and Chinese Patent Application No. 201911274713.6 are expressly incorporated herein by reference.

TECHNICAL FIELD

The present disclosure relates to the field of soldering, and in particular, to a reflow oven.

BACKGROUND

Reflow ovens are configured to solder elements on circuit boards to the circuit boards. Specifically, the reflow oven has a heating zone and a cooling zone. The heating zone is configured to heat the circuit board, such that solder paste (such as tin paste) on the circuit board is melted into a liquid state. The cooling zone is configured to solidify the liquid solder paste into a solid state, so that the solder paste is solidified in a selected area on the circuit board to solder an electronic element onto the circuit board.

SUMMARY OF THE DISCLOSURE

Exemplary embodiments of the present disclosure may solve at least some of the above problems. For example, the present disclosure provides a reflow oven. The reflow oven comprises a heating zone, a cooling zone, a barrier and exhaust zone, a gas exhaust passage, a gas exhaust power device, and a detection device. The heating zone comprises a heating zone inlet and a heating zone outlet. The cooling zone comprises a cooling zone inlet and a cooling zone outlet. The barrier and exhaust zone is located between the heating zone outlet and the cooling zone inlet. An inlet of the gas exhaust passage is communicated with the barrier and exhaust zone. The gas exhaust power device is disposed on the gas exhaust passage. The detection device is disposed on the gas exhaust passage and used for detecting parameters of gas in the gas exhaust passage, wherein the parameters of the gas reflect a blockage condition of the gas exhaust power device.

In the reflow oven according to the present disclosure, the reflow oven further comprises a control device. The control device is communicatively connected with the detection device. The detection device is configured to send a detection signal to the control device, and the control device is configured to receive the detection signal sent by the detection device.

In the reflow oven according to the present disclosure, the control device is communicatively connected with the gas exhaust power device, and the control device is configured to control the gas exhaust power device to turn on and turn off.

In the reflow oven according to the present disclosure, the reflow oven further comprises an audio or visual alarm device. The audio or visual alarm device is communicatively connected with the control device, the control device being configured to control the audio or visual alarm device to send audio or visual information based on the received detection signal sent by the detection device.

In the reflow oven according to the present disclosure, the reflow oven further comprises a heating device. The heating device is configured to heat the gas exhaust power device.

In the reflow oven according to the present disclosure, the control device is communicatively connected with the heating device, and the control device is configured to control the heating device to turn on and turn off based on a detection signal provided by the detection device.

In the reflow oven according to the present disclosure, the heating device comprises an electric heating wire, and the electric heating wire is arranged around the gas exhaust power device.

In the reflow oven according to the present disclosure, the detection device comprises a flow detection device for detecting quantity of flow of the gas in the gas exhaust passage.

In the reflow oven according to the present disclosure, the detection device comprises a pressure detection device for detecting pressure of the gas in the gas exhaust passage.

In the reflow oven according to the present disclosure, the gas exhaust power device comprises a vacuum generator, a fan or a pump.

The reflow oven according to the present disclosure can ensure that the gas containing soldering flux is sufficiently drawn out from the barrier and exhaust zone, thereby ensuring the production quality of a circuit board and improving the qualified rate of the circuit board.

BRIEF DESCRIPTION OF THE DRAWINGS

These and other features and advantages of the present disclosure may be better understood by reading the following detailed description with reference to the accompanying drawings. The same reference numerals represent the same components throughout the accompanying drawings, in which.

DETAILED DESCRIPTION OF EMBODIMENTS

Figure 1:
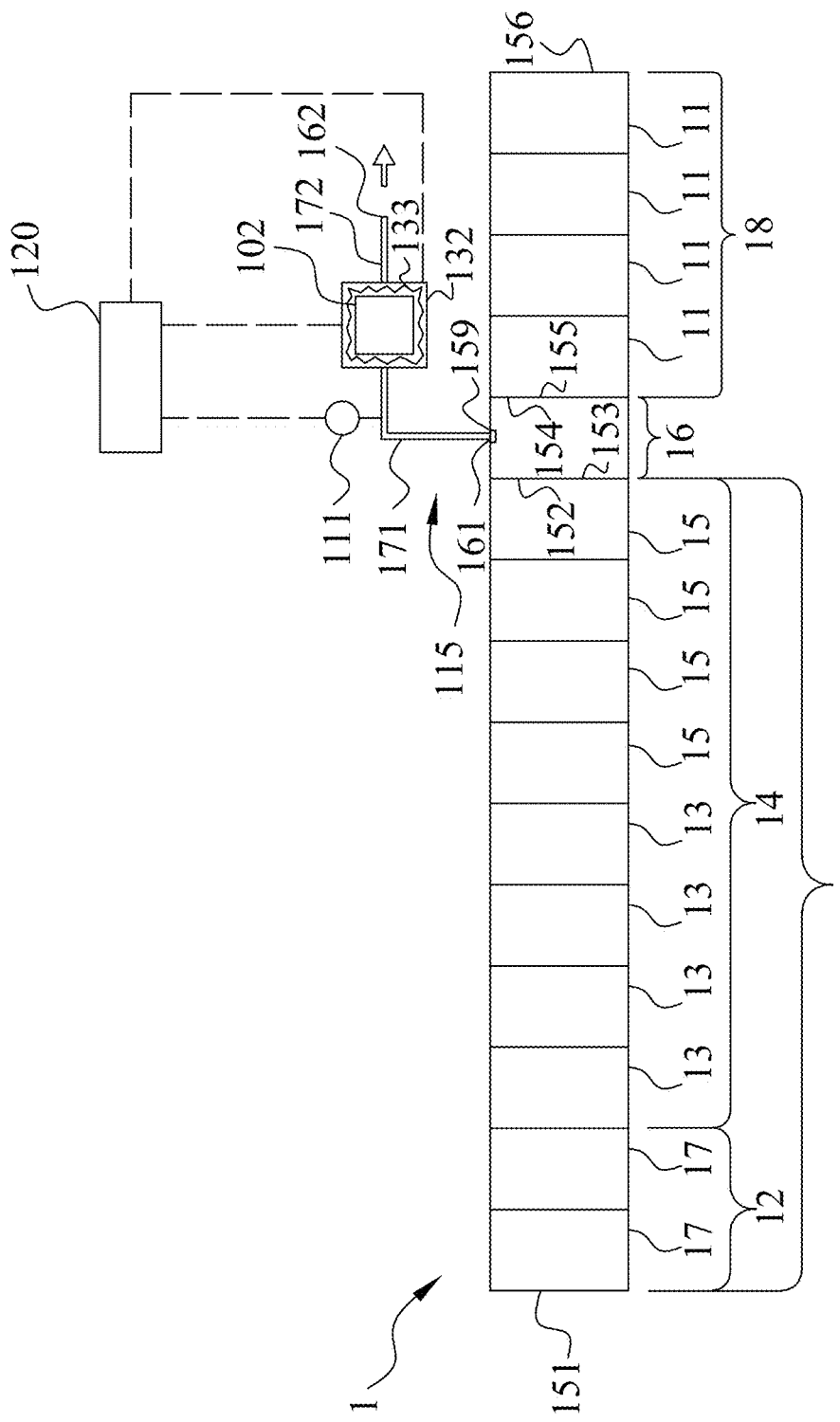
FIG. 1 is a simplified system diagram of a reflow oven according to an embodiment of the present disclosure.

Specific embodiments of the present disclosure are described below with reference to the accompanying drawings which constitute part of this description. In the following accompanying drawings, the same reference numerals are used for the same components, and similar reference numerals are used for similar components.

FIG. 1 is a simplified system diagram of a reflow oven 1 according to an embodiment of the present disclosure. As shown in FIG. 1, the reflow oven 1 comprises a heating zone 10, a barrier and exhaust zone 16, and a cooling zone 18. The heating zone 10 comprises a heating zone inlet 151 and a heating zone outlet 152. The barrier and exhaust zone 16 comprises a barrier and exhaust zone inlet 153, and a barrier and exhaust zone outlet 154. The cooling zone 18 comprises a cooling zone inlet 155 and a cooling zone outlet 156. The barrier and exhaust zone 16 is arranged between the heating zone 10 and the cooling zone 18. More specifically, the barrier and exhaust zone 16 is arranged between the heating zone outlet 152 and the cooling zone inlet 155. The barrier and exhaust zone inlet 153 is communicated with the heating zone outlet 152, and the barrier and exhaust zone outlet 154 is communicated with the cooling zone inlet 155. The barrier and exhaust zone 16 comprises a gas exhaust outlet 159 of the barrier and exhaust zone, which is configured to discharge gas in the reflow oven 1 out of the reflow oven 1, so as to prevent heat from the heating zone 10 from being transferred to the cooling zone 18.

The reflow oven 1 further comprises a hearth and a conveying component (not shown). The hearth is arranged to transversely pass through the heating zone 10, the barrier and exhaust zone 16 and the cooling zone 18, such that the heating zone 10, the barrier and exhaust zone 16 and the cooling zone 18 are fluidly communicated with one another. The conveying component is arranged in the hearth and also transversely passes through the heating zone 10, the barrier and exhaust zone 16 and the cooling zone 18. The conveying component is configured to carry a circuit board, such that the circuit board enters the reflow oven 1 through the heating zone inlet 151, sequentially passes through the heating zone 10, the barrier and exhaust zone 16 and the cooling zone 18, and then leaves from the reflow oven 1 through the cooling zone outlet 156.

Specifically, the heating zone 10 and the cooling zone 18 may each comprise a plurality of sub-zones. In the embodiment shown in FIG. 1, the heating zone 10 comprises ten sub-zones. The ten sub-zones comprise colder zones 12 and hotter zones 14. The hotter zones 14 have higher temperatures than the colder zones 12. The colder zones 12 comprise two preheating zones 17. The hotter zones 14 comprise four uniform temperature zones 13 and four peak zones 15. The preheating zones 17, the uniform temperature zones 13 and the peak zones 15 are arranged adjacent to one another. The heating zone 10 is configured to provide to the circuit board a temperature higher than the room temperature. The cooling zone 18 comprises four cooling sub-zones 11. The cooling zone 18 is configured to provide to the circuit board a temperature lower than that of the heating zone 10.

After the circuit board enters the reflow oven 1 through the heating zone inlet 151, the circuit board can be gradually heated in the preheating zones 17 and the uniform temperature zones 13. At least a part of soldering flux in solder paste on the circuit board will vaporize. In the peak zones 15, the circuit board continues to be heated and the solder paste is melted. Next, the circuit board passes through the barrier and exhaust zone 16. In the barrier and exhaust zone 16, high-temperature gas escaping from the heating zone outlet 152 is discharged through the gas exhaust outlet 159 of the barrier and exhaust zone, such that the cooling zone 18 can be kept at a lower temperature without being affected by the high-temperature gas escaping from the heating zone outlet 152. After passing through the barrier and exhaust zone 16, the circuit board is transported into the cooling zone 18. In the four cooling sub-zones 11, the solder paste is cooled and solidified on a soldering area of the circuit board, thereby connecting an electronic element to the circuit board.

The reflow oven 1 further comprises a gas exhaust passage 115 and a gas exhaust power device 102. The gas exhaust passage 115 comprises a gas exhaust passage inlet 161 and a gas exhaust passage outlet 162. The gas exhaust passage inlet 161 is connected to the gas exhaust outlet 159 of the barrier and exhaust zone, thereby communicating the gas exhaust passage 115 with the barrier and exhaust zone 16. The gas exhaust power device 102 is arranged on the gas exhaust passage 115 and is configured to provide power for drawing gas out of the barrier and exhaust zone 16. As an example, the gas exhaust power device 102 may be a vacuum generator, a pump or a fan.

More specifically, the gas exhaust passage 115 comprises a first gas exhaust passage 171 and a second gas exhaust passage 172. An inlet of the first gas exhaust passage 171 is the gas exhaust passage inlet 161 of the gas exhaust passage 115, and is connected to the gas exhaust outlet 159 of the barrier and exhaust zone. An outlet of the first gas exhaust passage 171 is connected to an inlet of the gas exhaust power device 102. An inlet of the second gas exhaust passage 172 is connected to an outlet of the gas exhaust power device 102. An outlet of the second gas exhaust passage 172 is the gas exhaust passage outlet 162 of the gas exhaust passage 115.

The reflow oven 1 further comprises a control device 120. The control device 120 is communicatively connected with the gas exhaust power device 102. The control device 120 can control the gas exhaust power device 102 to turn on and turn off.

The reflow oven 1 further comprises a detection device 111. The detection device 111 is disposed on the gas exhaust passage 115 and is used for detecting parameters of gas in the gas exhaust passage 115, wherein the parameters of the gas can reflect a blockage condition of the gas exhaust power device 102. In the embodiment of the present disclosure, the detection device 111 is disposed on the first gas exhaust passage 171. The detection device 111 is a differential pressure detection device for detecting a difference between a pressure of the gas in the gas exhaust passage 115 and an atmospheric pressure at the location where the differential pressure detection device is located. The control device 120 is communicatively connected with the detection device 111. The detection device 111 can provide a detection signal to the control device 120. The control device 120 is configured to receive the detection signal sent by the detection device 111.

The reflow oven 1 further comprises a heating device 132. The heating device 132 is arranged to heat the gas exhaust power device 102. The control device 120 is communicatively connected with the heating device 132. The control device 120 can receive the detection signal provided by the detection device 111 and control the heating device 132 to turn on and turn off according to the detection signal. As an example, the heating device 132 may comprise an electric heating wire 133, which is arranged around the gas exhaust power device 102. When the electric heating wire 133 is energized, electric energy can be converted into thermal energy, thereby heating the gas exhaust power device 102 and the gas flowing through the gas exhaust power device 102.

Through long-term observation, the inventor found that after the reflow oven runs for a long period of time, a residue is present on the soldered circuit board output from the cooling zone outlet. After analysis, the inventor found that the residue is liquid soldering flux or solid rosin in the soldering flux. The existence of such a residue will degrade the quality of the circuit board. After the reflow oven runs for a longer period of time, the amount of this residue will increase, and even reduce the qualified rate of the circuit board. According to the analysis of the overall operation of the reflow oven, the inventor found that this residue also exists on an inner side of a wall of the hearth in the cooling zone (i.e., on an inner side of a hearth housing), and most thereof exists on the inner side of the wall of the hearth in the cooling zone close to the barrier and exhaust zone. A large amount of accumulated residue will drip onto the circuit board, resulting in that the residue is also present on the circuit board. Through further analysis, the inventor believes that this situation is caused by the blockage of the gas exhaust power device. Specifically, the temperature in the heating zone is relatively high, generally reaching 280° C. As the first gas exhaust passage is fluidly communicated with the barrier and exhaust zone, the first gas exhaust passage is generally wrapped with a heat insulation material. However, the gas exhaust power device is often exposed to ambient air. A difference between the temperature of the ambient air and the temperature in the heating zone may reach 100° C. When the soldering flux gas comes into contact with the gas exhaust power device after being drawn out of the hearth, the soldering flux gas will be condensed into soldering flux solids and adhered to an inner wall of the gas exhaust power device due to the rapid temperature drop. With the accumulation of time, the flow area of the gas exhaust power device will decrease due to the adhesion of the soldering flux solids. This affects the gas exhaust effect of the barrier and exhaust zone, so that the soldering flux gas, that is generated in the heating zone and is unable to be sufficiently drawn out of the gas exhaust power device, enters the cooling zone and preferentially enters the cooling zone near the heating zone. After the temperature of the soldering flux gas gradually decreases in the cooling zone, the soldering flux gas is solidified into solids adhered to the wall of the cooling zone, and is partially condensed on the circuit board when passing through the cooling zone, thereby reducing the processing quality of the circuit board.

The heating device 132 in the reflow oven 1 of the present disclosure can heat the gas exhaust power device 102, such that the soldering flux solid solidified inside the gas exhaust power device 102 is heated up again to become gas. When the heating device 132 is turned on, the gas exhaust power device 102 is also kept on, so that the soldering flux gas is discharged from the gas exhaust power device 102. The gas exhaust power device 102 in the reflow oven 1 of the present disclosure can sufficiently draw the soldering flux gas out of the hearth, effectively preventing the soldering flux gas from condensing into the soldering flux solid and preventing the soldering flux gas from entering the cooling zone 18, thereby ensuring the production quality of the circuit board and significantly improving the qualified rate of the circuit board.

Figure 2:
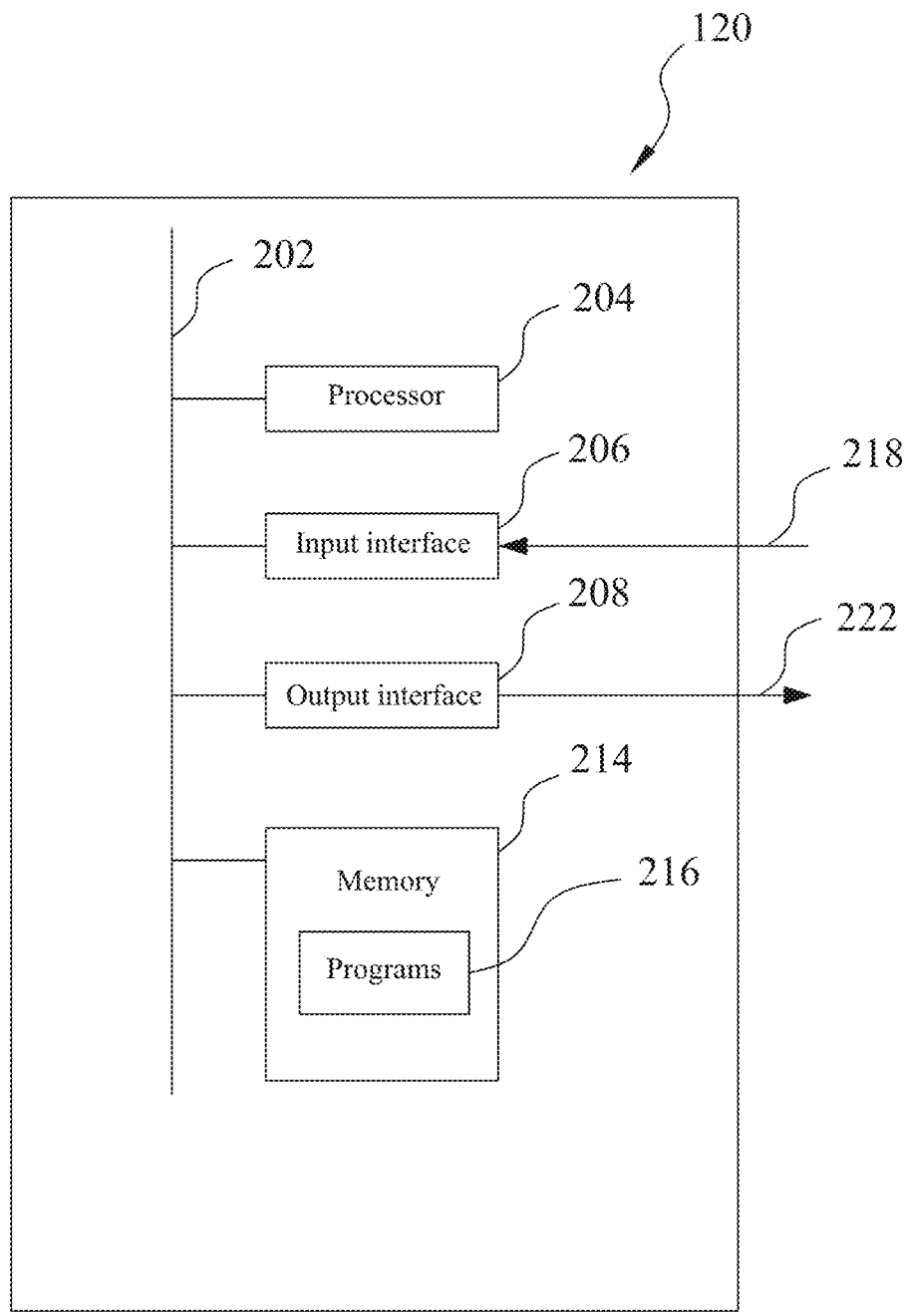
FIG. 2 is a simplified schematic diagram of an embodiment of a control device in FIG. 1.

FIG. 2 is a simplified schematic diagram of an embodiment of the control device 120 in FIG. 1. As shown in FIG. 2, the control device 120 comprises a bus 202, a processor 204, an input interface 206, an output interface 208, and a memory 214 having control programs 216. Each component in the control device 120, including the processor 204, the input interface 206, the output interface 208 and the memory 214, is communicatively connected with the bus 202, such that the processor 204 can control the operation of the input interface 206, the output interface 208 and the memory 214.

Specifically, the memory 214 is configured to store programs, instructions and data, while the processor 204 reads programs, instructions and data from the memory 214 and can write data to the memory 214.

The input interface 206 receives external signals and data, comprising the detection signal and data sent from the detection device 111, through a connection line 218. The output interface 208 sends control signals to the outside through a connection line 222, including sending on-off control signals to the heating device 132 and the gas exhaust power device 102. The memory 214 of the control device 120 stores data such as control programs and preset target setting values. Various parameters may be preset in production and manufacturing engineering, or may be set by manual input or data import when in use.

Figure 3:
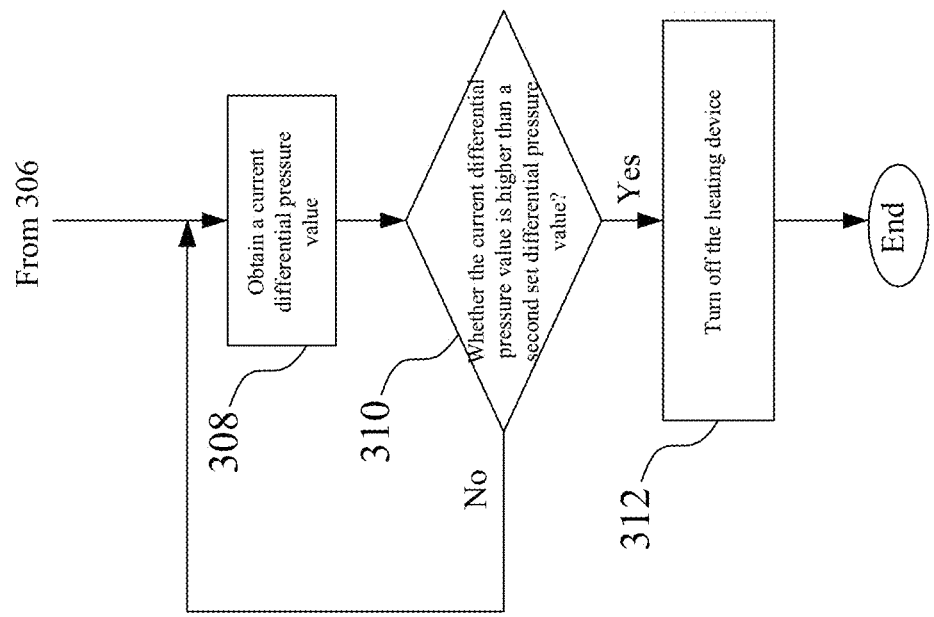
FIG. 3 is a schematic flow chart of control over a heating device of the reflow oven shown in FIG. 1 by the control device.
Figure 3:
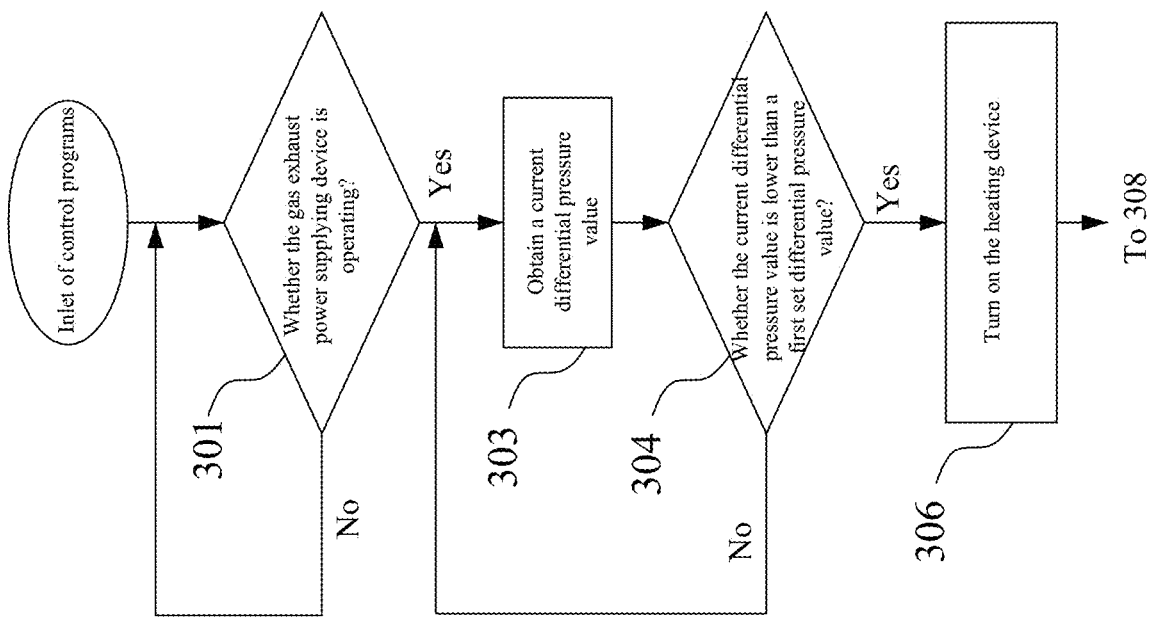

FIG. 3 is a schematic flow chart of control over the heating device 132 of the reflow oven 1 shown in FIG. 1 by the control device 120. A program of the flow chart shown in FIG. 3 is stored in the memory 214 of the control device 120. This control process can control the heating device 132 to turn on and turn off according to the detection signal sent by the detection device 111.

As shown in FIG. 3, in step 301, the processor 204 detects whether the gas exhaust power device 102 is operating. In other words, the processor 204 detects whether the gas exhaust power device 102 has been started. If the gas exhaust power device 102 is currently not in operation, the processor 204 switches the operation to step 301. If the gas exhaust power device 102 is currently in operation, the processor 204 switches the operation to step 303.

In step 303, the processor 204 obtains a current differential pressure value from the detection device 111. The processor 204 then switches the operation to step 304.

In step 304, the processor 204 determines whether the current differential pressure value is lower than a first set differential pressure value. If the current differential pressure value is not lower than the first set differential pressure value (that is, when the current differential pressure value is higher than or equal to the first set differential pressure value), the processor 204 switches the operation to step 303. If the current differential pressure value is lower than the first set differential pressure value, the processor 204 switches the operation to step 306.

In step 306, the processor 204 turns on the heating device 132. The processor 204 then switches the operation to step 308.

In step 308, the processor 204 obtains a current differential pressure value from the detection device 111. The processor 204 then switches the operation to step 310.

In step 310, the processor 204 determines whether the current differential pressure value is higher than a second set differential pressure value. If the current differential pressure value is not higher than the second set differential pressure value (that is, when the current differential pressure value is lower than or equal to the second set differential pressure value), the processor 204 switches the operation to step 309. If the current differential pressure value is higher than the second set differential pressure value, the processor 204 switches the operation to step 312.

In step 312, the processor 204 turns off the heating device 132. The processor 204 then ends the control process.

It should be noted that, in the embodiment shown in FIG. 3, the gas exhaust power device 102 is operating while the heating device 132 is operating, because generally, when the gas exhaust power device 102 is operating, the soldering flux gas flows through the gas exhaust power device 102 and is solidified on the gas exhaust power device 102. However, those skilled in the art can understand that the heating device 132 may also be turned on when the gas exhaust power device 102 is not operating, so as to remove the soldering flux solids adhered to the gas exhaust power device 102.

As an example, the first set differential pressure value may be 80 Pa and the second set pressure value may be 180 Pa. When the current differential pressure value is lower than the first set differential pressure value of 80 Pa, it indicates that the gas exhaust power device 102 cannot provide an enough drawing capacity, and in this case, it is necessary to turn on the heating device 132 to heat the soldering flux solids in the gas exhaust power device 102 and turn the solids into soldering flux gas. As the soldering flux solids are heated to become soldering flux gas, the soldering flux solids adhered to the gas exhaust power device 102 gradually decrease, the gas flow area of the gas exhaust power device 102 increases, and the current differential pressure value also increases. When the current differential pressure value is higher than the second set pressure value of 180 Pa, it indicates that the gas exhaust power device 102 can provide at least a drawing capacity of 180 Pa, and in this case, the gas exhaust power device 102 can provide an enough drawing capacity, and the heating device 132 can be turned off.

It should be noted that although 80 Pa is set as the first set differential pressure value and 180 Pa is set as the second set pressure value in the present disclosure, those skilled in the art can understand that the first set differential pressure value and the second set pressure value may be specifically set according to a working condition of the reflow oven 1. In addition, the magnitude of the first set differential pressure value may be different from that of the second set pressure value, or may be equal to that of the second set pressure value (i.e., the first set differential pressure value is equal to the second set pressure value).

Figure 4A:
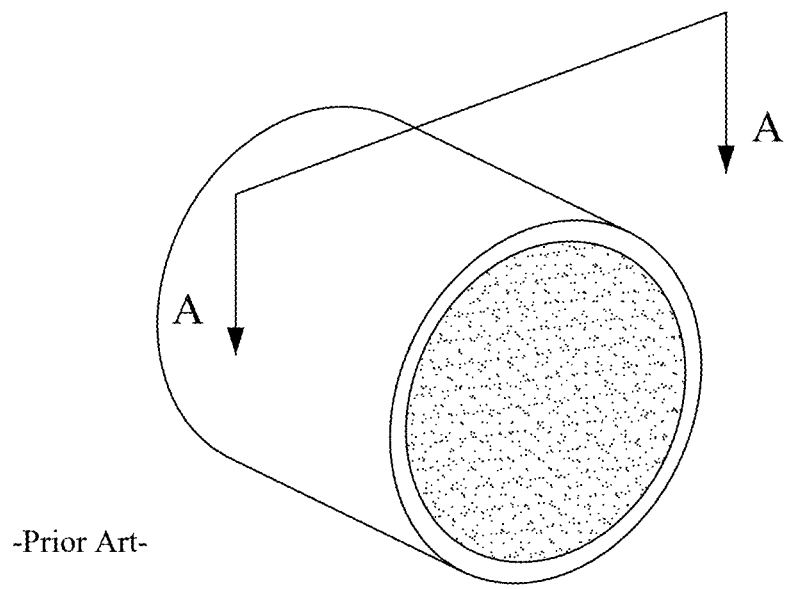
FIG. 4A is a perspective diagram of a pipe wall of a conventional gas exhaust power device without a heating device.
Figure 4B:
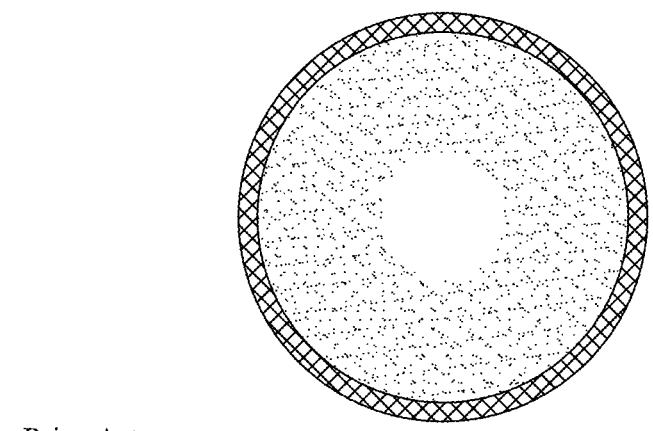
FIG. 4B is a cross-sectional diagram of the pipe wall of the gas exhaust power device shown in FIG. 4A along a section line A-A in FIG. 4A.

It should also be noted that although the detection device 111 in the embodiment of the present disclosure is a differential pressure detection device (e.g., a differential pressure sensor), those skilled in the art can understand that the detection device 111 may also be a pressure detection device (e.g., a pressure sensor) for detecting pressure of gas in the gas exhaust passage 115. Those skilled in the art can also understand that the detection device 111 may also be a flow detection device (e.g., a flow sensor) for detecting quantity of flow of the gas in the gas exhaust passage 115. The blockage in the gas exhaust power device 102 is determined according to the flow value of the gas in the gas exhaust passage 115, such that a first set flow value and a second set flow value (the first set flow value may be equal to the second set flow value) are set to control the heating device 132 to turn on and turn off. FIG. 4A is a perspective diagram of a pipe wall of a conventional gas exhaust power device without a heating device; and FIG. 4B is a cross-sectional diagram of the pipe wall of the gas exhaust power device shown in FIG. 4A along a section line A-A in FIG. 4A. Dotted shadows indicate soldering flux solids adhered to the wall. It can be seen from FIGS. 4A and 4B that the flow area of the gas exhaust power device will be reduced by nearly 70%. This will greatly reduce the speed at which the soldering flux gas is discharged from the hearth and reduce the qualified rate of the circuit board.

Figure 5A:
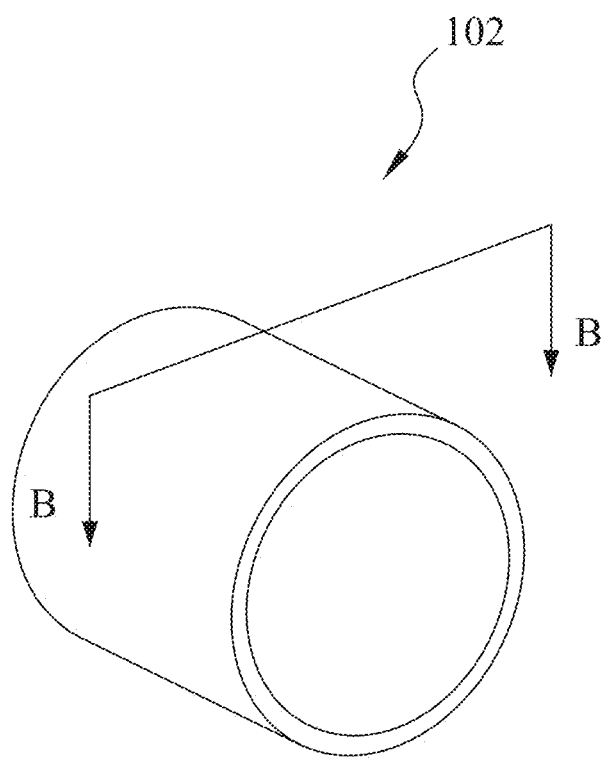
FIG. 5A is a perspective diagram of a pipe wall of a gas exhaust power device according to the present disclosure with a heating device.
Figure 5B:
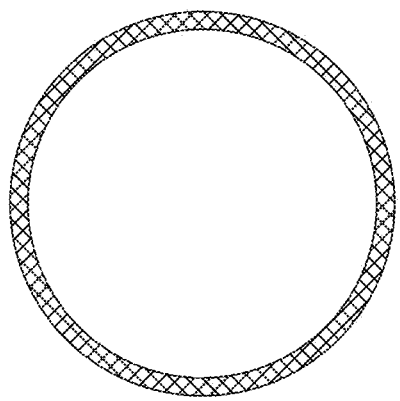
FIG. 5B is a cross-sectional diagram of the pipe wall of the gas exhaust power device shown in FIG. 5A along a section line B-B in FIG. 5A.

FIG. 5A is a perspective diagram of a pipe wall of a gas exhaust power device according to the present disclosure with a heating device; and FIG. 5B is a cross-sectional diagram of the pipe wall of the gas exhaust power device shown in FIG. 5A along a section line B-B in FIG. 5A. Dotted shadows indicate soldering flux solids adhered to the wall. It can be seen from FIGS. 5A and 5B that almost no soldering flux solid is adhered to the wall of the gas exhaust power device. This can ensure that the actual flow area of the gas exhaust power device is consistent with a designed flow area thereof, thereby ensuring the speed at which the soldering flux gas is discharged from the hearth and greatly improving the qualified rate of the circuit board.

Figure 6:
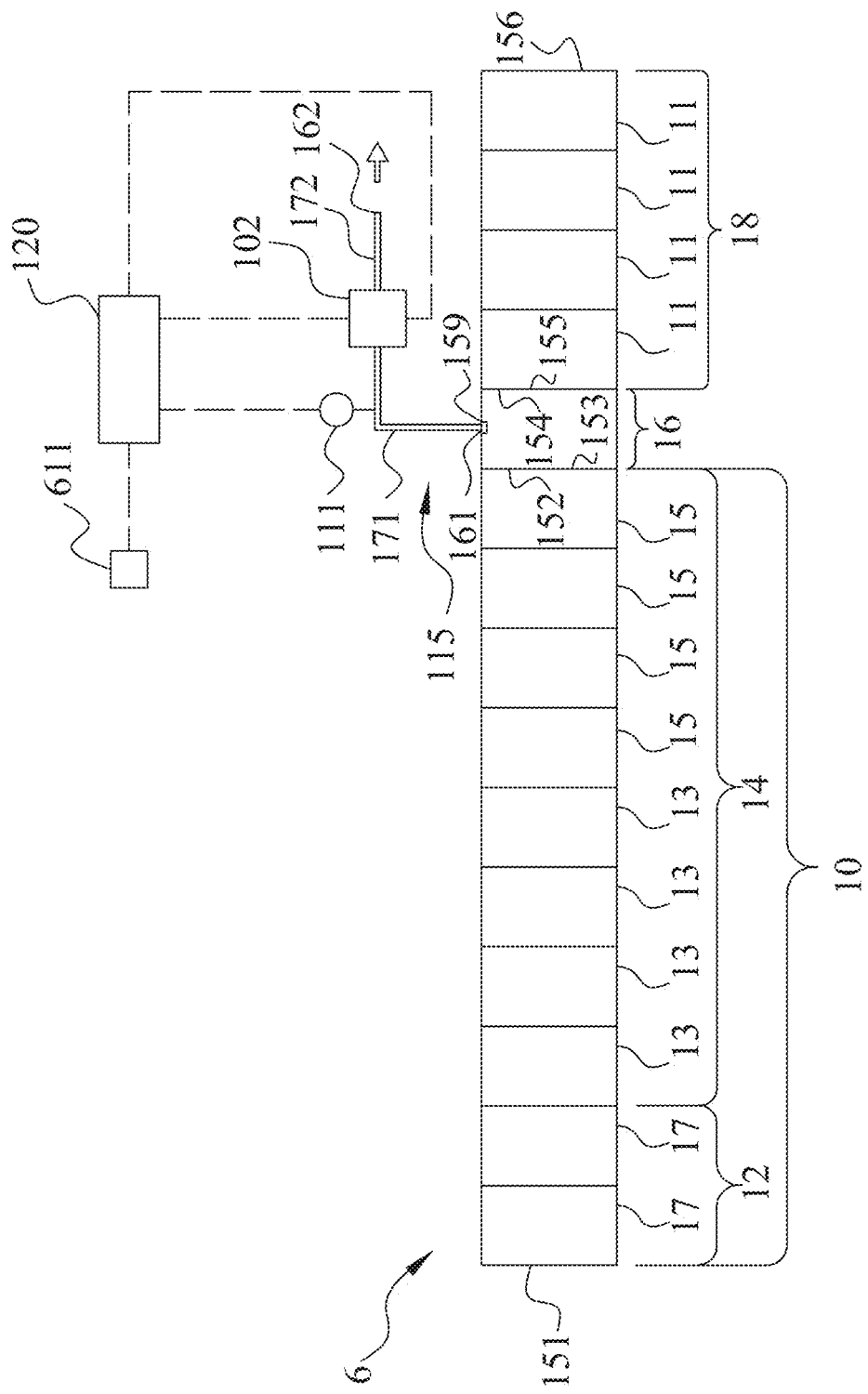
FIG. 6 is a simplified system diagram of a reflow oven according to another embodiment of the present disclosure.

FIG. 6 is a simplified system diagram of a reflow oven 6 according to another embodiment of the present disclosure. The same parts of the reflow oven 6 of FIG. 6 as those of the reflow oven 1 of FIG. 1 will not be repeated herein. This reflow oven differs from the reflow oven 1 of FIG. 1 in that the reflow oven 6 of FIG. 6 comprises an audio or visual alarm device 611, but does not comprise a heating device for heating the gas exhaust power device 102. The audio or visual alarm device 611 is communicatively connected with the control device 120. The control device 120 is configured to control the audio or visual alarm device 611 to send audio or visual information based on the received detection signal sent by the detection device 111. Specifically, when the control device 120 receives gas parameters from the detection device 111 and determines that the gas parameters reflect that the gas exhaust power device 102 is blocked, the control device 120 will send a signal to the audio or visual alarm device 611. The audio or visual alarm device 611 can send audio or visual information to alarm an operator. As an example, the audio or visual alarm device 611 comprises a tweeting device, a warning device, or a display device. When the operator is aware of the alarm from the audio or visual alarm device 611, the gas exhaust power device 102 may be removed and replaced with a new gas exhaust power device, thereby ensuring the actual flow area of the gas exhaust power device, ensuring the speed at which the soldering flux gas is discharged from the hearth and greatly improving the qualified rate of the circuit board.

Although only some features of the present disclosure are illustrated and described herein, a person skilled in the art may make various improvements and changes. Therefore, it should be understood that the appended claims intend to cover all the foregoing improvements and changes that fall within the substantial spirit and scope of the present disclosure.

The invention claimed is:

1. A reflow oven, wherein the reflow oven comprises:
   a heating zone comprising a heating zone inlet and a heating zone outlet;
   a cooling zone comprising a cooling zone inlet and a cooling zone outlet;
   a barrier and exhaust zone located between the heating zone outlet and the cooling zone inlet;
   a gas exhaust passage, wherein an inlet of the gas exhaust passage is in communication with the barrier and exhaust zone;
   a gas exhaust power device disposed on the gas exhaust passage; and
   a detection device disposed on the gas exhaust passage and used for detecting a pressure of gas in the gas exhaust passage, wherein when the pressure of the gas is below a threshold, a heating device is turned on and when the pressure of the gas is above the threshold, the heating device is turned off.

2. The reflow oven of claim 1, further comprising:
   a control device communicatively connected with the detection device, wherein the detection device is configured to send a detection signal to the control device, and the control device is configured to receive the detection signal sent by the detection device.

3. The reflow oven of claim 2, wherein the control device is communicatively connected with the gas exhaust power device, and the control device is configured to control the gas exhaust power device to turn on and turn off.

4. The reflow oven of claim 2, further comprising:
an audio or visual alarm device communicatively connected with the control device, the control device being configured to control the audio or visual alarm device to send audio or visual information based on the received detection signal sent by the detection device.

5. The reflow oven of claim 2, wherein the control device is communicatively connected with the heating device, and the control device is configured to control the heating device to turn on and turn off based on the detection signal provided by the detection device.

6. The reflow oven of claim 1, wherein the heating device comprises an electric heating wire, and the electric heating wire is arranged around the gas exhaust power device.

7. The reflow oven of claim 1, wherein the detection device comprises a flow detection device for detecting quantity of flow of the gas in the gas exhaust passage.

8. The reflow oven of claim 1, wherein the detection device comprises a pressure detection device for detecting pressure of the gas in the gas exhaust passage.

9. The reflow oven of claim 1, wherein the gas exhaust power device comprises a vacuum generator, a fan or a pump.

* * * * *